(12) United States Patent
Chen et al.

(10) Patent No.: US 7,755,965 B2
(45) Date of Patent: Jul. 13, 2010

(54) TEMPERATURE DEPENDENT SYSTEM FOR READING ST-RAM

(75) Inventors: Yiran Chen, Eden Prairie, MN (US);
Hai Li, Eden Prairie, MN (US);
Hongyue Liu, Maple Grove, MN (US);
Henry F. Huang, Apple Valley, MN (US); Yong Lu, Rosemount, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 83 days.

(21) Appl. No.: 12/250,036

(22) Filed: Oct. 13, 2008

(65) Prior Publication Data

US 2010/0091562 A1   Apr. 15, 2010

(51) Int. Cl.
*G11C 7/04* (2006.01)
*G11C 11/00* (2006.01)
*G11C 7/02* (2006.01)

(52) U.S. Cl. .................. 365/211; 365/158; 365/209; 365/210.1; 365/213

(58) Field of Classification Search ................. 365/157, 365/158, 171, 209, 211, 213, 210.1
See application file for complete search history.

(56) References Cited

U.S. PATENT DOCUMENTS

| 7,283,414 B1* | 10/2007 | So et al. ............... 365/211 |
| 7,411,830 B2 | 8/2008 | Takeuchi |
| 7,515,457 B2 | 4/2009 | Chen |
| 2004/0100831 A1* | 5/2004 | Knall et al. .............. 365/200 |
| 2005/0036362 A1* | 2/2005 | Iwata et al. .............. 365/158 |
| 2008/0219043 A1 | 9/2008 | Yoon |
| 2008/0273380 A1 | 11/2008 | Diao |
| 2009/0040855 A1 | 2/2009 | Luo |
| 2009/0185410 A1 | 7/2009 | Huai |
| 2009/0310408 A1* | 12/2009 | Lee et al. ............... 365/185.03 |
| 2010/0046311 A1* | 2/2010 | Macerola et al. ............. 365/211 |

OTHER PUBLICATIONS

Zhai et al., Detection of On-Chip Temperature Gradient Using a 1.5V Low Power CMOS Temperature Sensor, 2006 IEEE, pp. 1171-1173.
Hosomi et al., A Novel Nonvolatile Memory with Spin Torque Transfer Magnetization Switching: Spin-RAM, 2005 IEEE, pp. 459-462.
Zeki et al., Tunable Linear CMOS Current Mirror, Analog Integrated Circuits and Signal Processing, vol. 50, No. 3, Mar. 2007.

* cited by examiner

*Primary Examiner*—Ly D Pham
(74) *Attorney, Agent, or Firm*—Campbell Nelson Whipps LLC

(57) ABSTRACT

A memory device that includes at least one memory cell, the memory cell includes: a magnetic tunnel junction (MTJ); and a transistor, wherein the transistor is operatively coupled to the MTJ; a bit line; a source line; and a word line, wherein the memory cell is operatively coupled between the bit line and the source line, and the word line is operatively coupled to the transistor; a temperature sensor; and control circuitry, wherein the temperature sensor is operatively coupled to the control circuitry and the control circuitry and temperature sensor are configured to control a current across the memory cell.

17 Claims, 5 Drawing Sheets

TEMPERATURE DEPENDENT SYSTEM FOR READING ST-RAM

BACKGROUND

New types of memory have demonstrated significant potential to compete with commonly utilized types of memory. For example, non-volatile spin-transfer torque random access memory (referred to herein as "ST-RAM") has been discussed as a "universal" memory. ST-RAM memory includes a magnetic tunnel junction (MTJ).

MTJs are written to by flowing a large enough magnitude current through the MTJ. Therefore, it is important, when reading a MTJ, that the current not be so large that it not only reads the data in the MTJ but writes into the MTJ. The writing current magnitude required by MTJ resistance switching is mainly determined by the writing pulse width. For relatively long pulse switching (>10 ns), current magnitude agrees with the theoretical equation, which is given by Equation (1):

$$I_C = I_{C0}\left\{1 - \left(\frac{kT}{E}\right)\ln\left(\frac{\tau}{\tau_0}\right)\right\} \quad \text{(Equation 1)}$$

Where $I_C$ is the critical switching current, which is the minimal current required for MTJ resistance switching; $I_{C0}$ is the critical switching current at 0° K; E is the magnetization stability energy barrier; $\tau$ is pulse duration time; and $\tau_0$ is the inverse of the attempt frequency. As seen from this equation, the smaller the switching current that is applied, the longer the writing pulse width that is required.

Based on Eq. (1), when the working temperature increases, the required switching current for a fixed write pulse duration will decrease. This relationship is referred to as the "Thermal Stability" issue of STRAM. Considering the process variation, the thermal stability of STRAM can be represented by the shifting of the mean of required switching current.

When actual memory is designed, the current through the MTJ is designed to ensure that most of the MTJs can be switched as expected. This is generally referred to as "corner-based" design. For example, the current through the MTJ is designed to make sure that three sigma (3σ, or 99.73%) of the MTJ can be switched successfully. After considering the design corner that covers this variation, the critical write current under high temperature may be similar or even larger than the one under low temperature. For this reason, memory designers overcompensate, e.g., a transistor that is large enough to provide enough current in both high and low temperature may be required to overcome such thermal stability issues of STRAM.

BRIEF SUMMARY

Disclosed herein is a memory device that includes at least one memory cell, the memory cell includes: a magnetic tunnel junction (MTJ); and a transistor, wherein the transistor is operatively coupled to the MTJ; a bit line; a source line; and a word line, wherein the memory cell is operatively coupled between the bit line and the source line, and the word line is operatively coupled to the transistor; a temperature sensor; and control circuitry, wherein the temperature sensor is operatively coupled to the control circuitry and the control circuitry and temperature sensor are configured to control a current across the memory cell.

Also disclosed is a method of reading data from a ST-RAM cell, the method including sensing the temperature in the vicinity of the ST-RAM cell; activating a transistor associated with the ST-RAM cell; passing a current across the ST-RAM cell; sensing the voltage differential across the ST-RAM cell; and comparing the sensed voltage differential to a reference voltage differential to determine the resistance across the memory cell, wherein the resistance across the memory cell indicates the data contained in the memory cell wherein the current passed across the ST-RAM cell is modulated by the sensed temperature.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

An embodiment of a memory system as disclosed herein can include a memory cell and a temperature sensor. Generally, the memory cell is a magneto resistive random access memory (MRAM) cell. In an embodiment, the memory cell is a spin transfer torque random access memory (ST-RAM) cell.

Figure 1A:
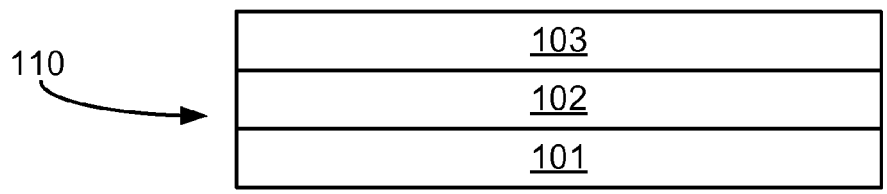
FIGS. 1a, 1b and 1c are illustrations (FIGS. 1a and 1b) of magnetic tunnel junctions (MTJs) and a MTJ within a memory device (FIG. 1c)
Figure 1B:
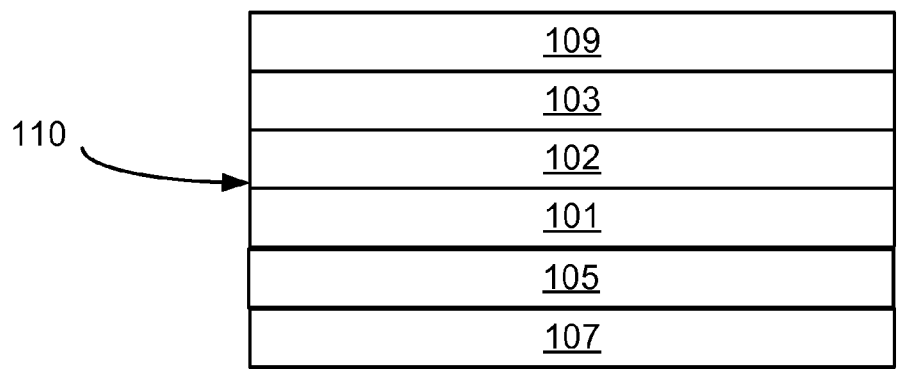

Generally, ST-RAM includes a magnetic tunnel junction (MTJ). A MTJ generally includes two magnetic layers separated by a thin insulating layer known as a tunnel barrier. An embodiment of a MTJ is depicted in FIG. 1a. The MTJ 110 in FIG. 1a includes a first magnetic layer 101 and a second magnetic layer 103, which are separated by an insulating layer 102. The insulating layer 102 generally includes an insulating material such as aluminum oxide ($Al_2O_3$) or magnesium oxide (MgO). The first magnetic layer 101 and the second magnetic layer 103 generally include magnetic materials, such as those including cobalt (Co), iron (Fe), and nickel (Ni) or their alloys. FIG. 1b depicts a MTJ 110 that includes an antiferromagnetic layer 105, which is in contact with a first electrode 107. This exemplary MTJ also includes a second electrode 109 in contact with the second magnetic layer 103. The first electrode 107 and the second electrode 109 electrically connect the first magnetic layer 101 and the second magnetic layer 103 respectively to a control circuit (not shown) that can provide read and write currents through the magnetic layers.

The electrical resistance across the MTJ 110 can be determined by the relative orientation of the magnetization vectors of the first magnetic layer 101 and the second magnetic layer 103.

The magnetization of one of the magnetic layers, for example the first magnetic layer 101 is generally pinned in a predetermined direction, while the magnetization direction of the other magnetic layer, for example the second magnetic layer 103 is free to rotate under the influence of a spin torque. Pinning of the first magnetic layer 101 may be achieved through, e.g., the use of an exchange bias with an antiferromagnetically ordered material such as PtMn, IrMn and others (as demonstrated by the antiferromagnetic layer 105 depicted in FIG. 1b which can be utilized to pin the first magnetic layer 101).

Figure 1C:
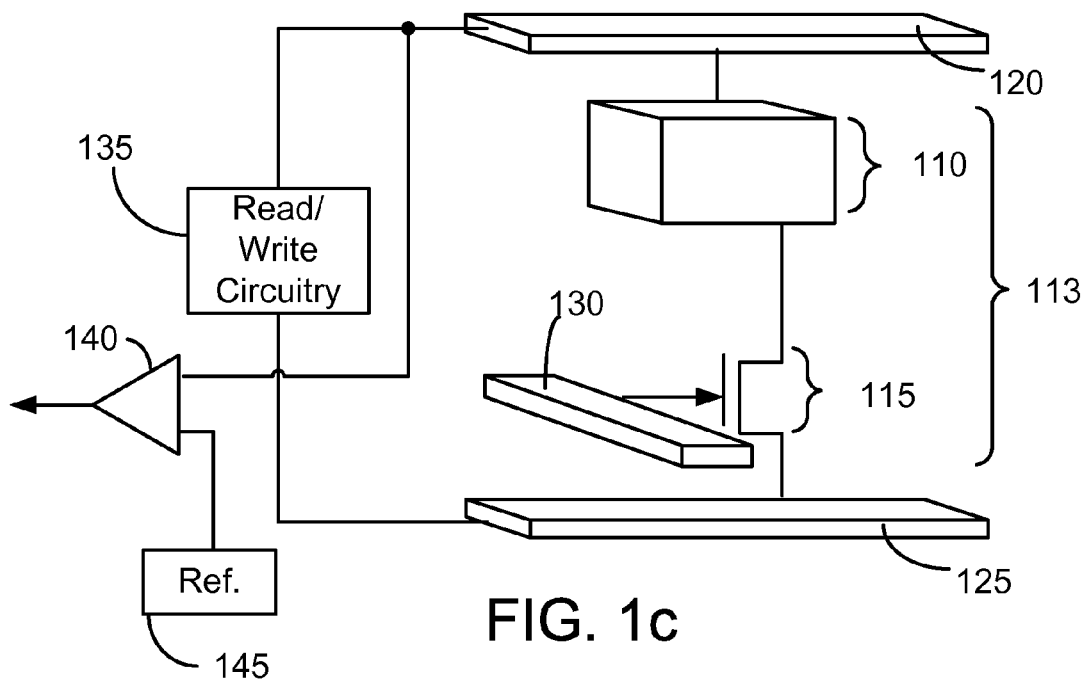

A memory device generally utilizes a MTJ 110 in combination with other electrical components, such a combination can be referred to as a memory cell. As seen in FIG. 1c, a memory cell 113 can include a MTJ 110 and its corresponding transistor 115. Each memory cell 113 is then configured within a larger system. The memory cell 113 is operatively coupled between a bit line 120 and a source line 125. The read/write circuitry 135 controls which bit line 120 and source line 125 that current is passed through to read or write. The read/write circuitry 135 can also control the voltage applied across the bit line 120 or memory cell 113 from the source line 125 (or vice versa). The direction which current flows across a MTJ 110 is determined by the voltage differential across the bit line 120 and the source line 125.

A particular MTJ 110 can be read from by activating its corresponding transistor 115, which when turned on, allows current to flow from the bit line 120 through the MTJ 110 to the source line 125 (or vice versa). The transistor 115 is activated and inactivated through the word line 130. The word line 130 is operatively coupled to and supplies a voltage to the transistor 115 to turn the transistor on so that current can flow to the MTJ 110. A voltage, dependent on the resistance of the MTJ 110 is then detected by the sense amplifier 140 from the source line 125 (for example). The voltage differential between the bit line 120 and the source line 125 (or vice versa), which is indicative of the resistance of the MTJ is then compared to a reference voltage 145 and amplified by the sense amplifier 140 to determine whether the MTJ 110 contains a "1" or a "0".

An embodiment of a memory device as disclosed herein also includes a temperature sensor.

A temperature sensor utilized herein can function to detect the temperature in the vicinity of a memory cell. Generally, a temperature sensor and a memory cell as utilized herein are relatively closely located. In an embodiment, a temperature sensor is located in the vicinity of a memory cell. The phrase "vicinity of the memory cell" can generally imply that the temperature sensor is on the same chip as the memory cell. In an embodiment, there is more than one temperature sensor on each chip; and in another embodiment, there is only one temperature sensor on each chip. In an embodiment, where the memory system includes a plurality of memory cells, one temperature sensor can be located in the vicinity of each of the plurality of memory cells. In an embodiment, a temperature sensor can be located in a central location with respect to the plurality of memory cells.

Generally, any temperature sensor that is small enough to be fabricated or placed on a chip housing the memory cell can be utilized. One example of a suitable temperature sensor would be a low power CMOS temperature sensor. A temperature sensor to be utilized herein can be fabricated on the chip or can be fabricated separately and placed on the chip.

The temperature sensor generally functions to sense the temperature in the vicinity of the memory cell. A system as disclosed herein utilizes the sensed temperature to adjust one or more characteristics of a read operation based on the sensed temperature. For example, in an embodiment a sensed temperature could be utilized to control the current flowing from the bit line to the MTJ. In an embodiment, a sensed temperature could be utilized to control the voltage of the word line, which ultimately controls the current flowing to the MTJ. Both of these are ways of controlling the magnitude of the current flowing through the MTJ. As the voltage of the word line is decreased or the current to the bit line is decreased, the current across the MTJ will be lower. Similarly, as the voltage of the word line is increased or the current to the bit line is increased, the current across the MTJ will be increased.

As discussed above, as the temperature increases, the current necessary to write a value to a MTJ (i.e. change the magnetization of the free layer) decreases. Therefore, as the temperature increases (as sensed by the temperature sensor in the vicinity of the memory cell) the current sent through the MTJ can be decreased in order to ensure that the MTJ is not inadvertently written to. In memory systems disclosed herein, a temperature sensor in the vicinity of the memory cell is utilized to control or modulate the current flowing through the MTJ. This current can be modulated by controlling the current through the bit line or by controlling the voltage to the word line. Memory systems as disclosed herein can be utilized in either way or both ways.

Figure 2A:
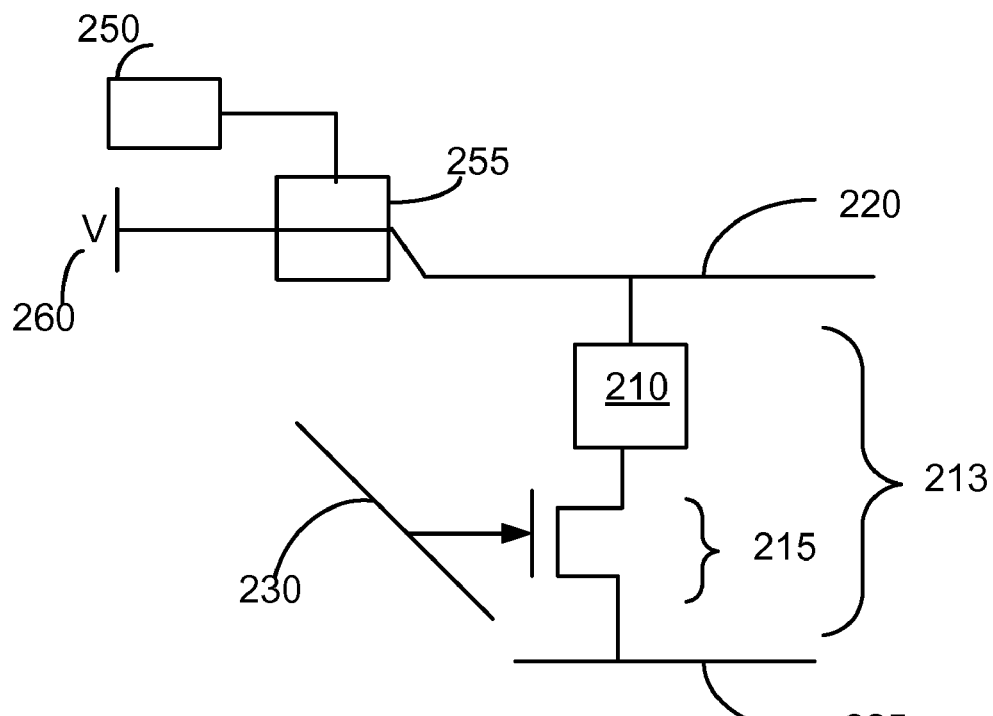
FIGS. 2a and 2b are illustrations of memory devices as disclosed herein that modulate current through the MTJ by modulating current to the bit line.

An embodiment of a memory device as disclosed herein is depicted in FIG. 2a. Such a memory system includes a memory cell 213 that includes a MTJ 210 and a transistor 215. The transistor 215 is coupled to a word line 230. The memory cell 213 is operatively coupled between a bit line 220 and a source line 225. A memory system as disclosed herein also includes a temperature sensor 250. The temperature sensor 250 is located in the vicinity of the memory cell and is configured to sense the temperature in the vicinity of the memory cell.

A memory system as disclosed herein can also include control circuitry 255. Control circuitry 255 controls or biases a source voltage 260. The source voltage 260 can but need not be a core voltage (Vdd for example). The control circuitry 255 can include for example a current mirror, such as a tunable linear complimentary metal-oxide-semiconductor (CMOS) current mirror. The control circuitry 255 can be incorporated into already existing electrical components, such as for example read/write circuitry that was discussed previously or can be configured separately and used in addition to previously existing electrical components.

In such an embodiment, the temperature sensor 250 can be operatively coupled to the control circuitry 255. The control circuitry 255 operates to change the current going into the MTJ 210 from the bit line 220 from the source voltage 260. For example at high temperatures, the control circuitry 255 can decrease the current going into the bit line 220 so that the read operation does not inadvertently rewrite the data in the MTJ 210. In an embodiment, the control circuitry 255 can be configured not to affect read operations until a particular threshold temperature is met (based on readings from the temperature sensor). In an embodiment, the control circuitry 255 can be configured not to affect read operations until a temperature of about 40° C. or greater is read by the temperature sensor.

Figure 2B:
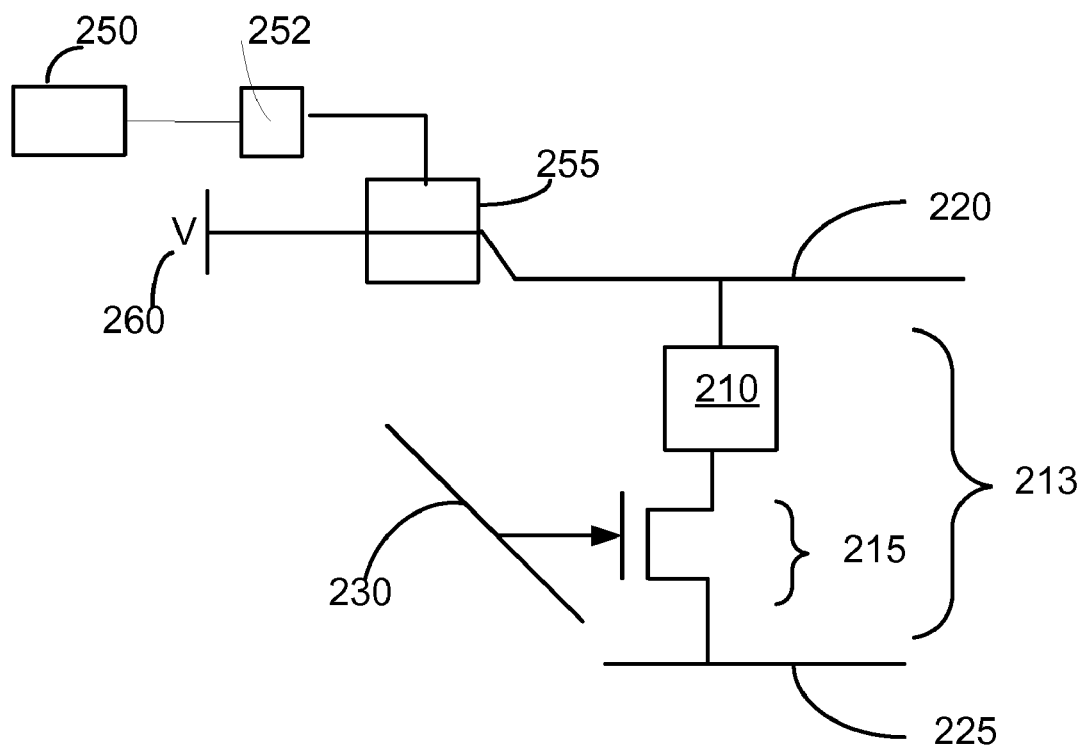

In an embodiment where the temperature sensor 250 has an analog output and the control circuitry 255 requires or functions better with a digital input, an analog to digital converter can be utilized. FIG. 2b illustrates such an embodiment of a memory device having an analog to digital converter 252 operatively coupled between the temperature sensor 250 and the control circuitry 255.

Figure 3A:
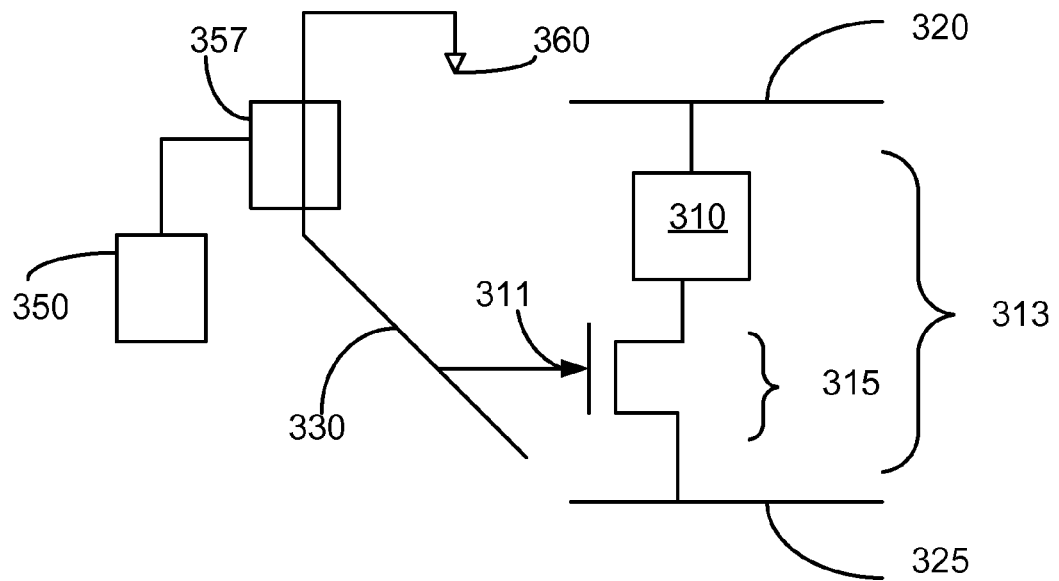
FIGS. 3a and 3b are illustrations of memory devices as disclosed herein that modulate current through the MTJ by modulating voltage to the transistor.

An embodiment of a memory device as disclosed herein is depicted in FIG. 3a. Such a memory system includes a memory cell 313 that includes a MTJ 310 and a transistor 315. The transistor 315 is coupled to a word line 330. The memory cell 313 is operatively coupled between a bit line 320 and a source line 325. A memory system as disclosed herein also includes a temperature sensor 350 and control circuitry 357. Control circuitry 357 controls or biases a source voltage 360. The control circuitry 357 can include for example, a voltage regulator. The control circuitry 357 can be incorporated into already existing electrical components, such as for example read/write circuitry that was discussed previously or can be configured separately and used in addition to previously existing electrical components.

In such an embodiment, the temperature sensor 350 can be operatively coupled to the control circuitry 357. The control circuitry 357 operates to change the voltage from the word line 330 into the transistor 315, which is also referred to as the gate voltage 311. The gate voltage 311 then controls the transistor 315 to determine the amount of current that flows through the transistor 315 and into the MTJ 310. For example at high temperatures, the control circuitry 357 can decrease the voltage at the word line 330, which thereby decrease the current going out of the transistor 315 and into the MTJ 310 so that the read operation does not inadvertently rewrite the data in the MTJ 310. In an embodiment, the control circuitry 357 can be configured not to affect read operations until a particular threshold temperature is met (based on readings from the temperature sensor). In an embodiment, the control circuitry 255 can be configured not to affect read operations until a temperature of about 40° C. or greater is read by the temperature sensor.

Figure 3B:
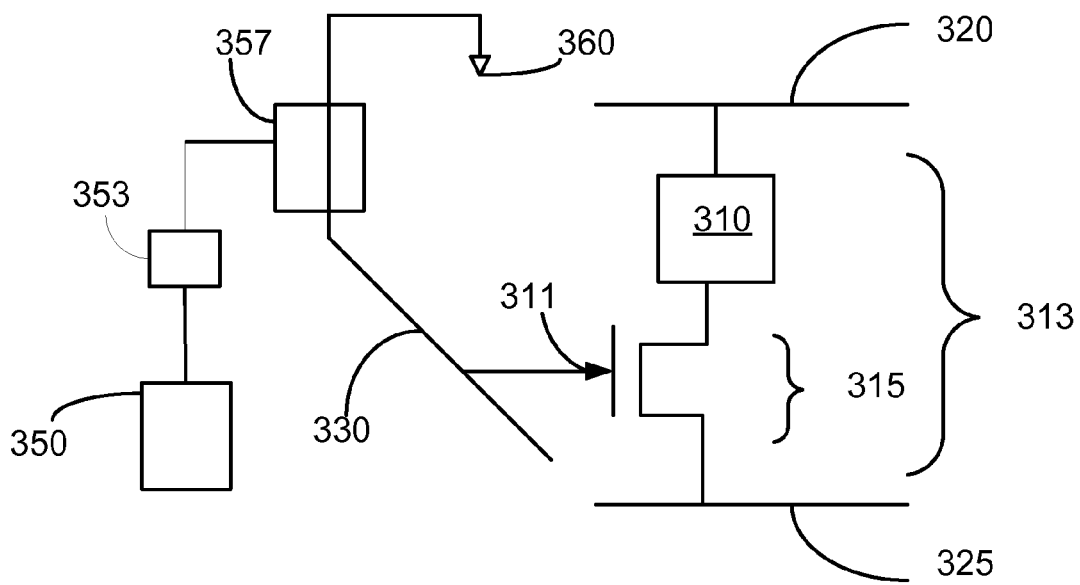

In an embodiment where the temperature sensor 350 has an analog output and the control circuitry 357 requires or functions better with a digital input, an analog to digital converter can be utilized. FIG. 3b illustrates such an embodiment having an analog to digital converter 353 operatively coupled between the temperature sensor 350 and the control circuitry 357.

As discussed above, a read operation determines the state ("1" or "0") of the MTJ by comparing a voltage (that is indicative of the resistance of the MTJ) to a reference voltage. The reference voltage is generally determined by running the same current (a read current) across one or more "dummy" cells. Therefore, as the read current is modulated (either by changing the current to the bit line or the voltage to the word line) a modulated read current can be sent through at least one dummy cell in order to generate a modulated reference voltage. Generation of a modulated reference voltage may lead to some delay during a read operation but should not become noticeable to the system.

A system can be modified to monitor any delay that may be occurring. Once a delay becomes noticeable, the amount of clock cycles necessary for a read operation will generally increase. The system can generate a notice if or when this happens. Once noticed, the system can compensate for the delay, such as for example by waiting more clock cycles when reading data from memory. The system could also be modified to store such delays as well as the data from the temperature sensor so that the delay can be correlated to the temperature increase.

Figure 5:
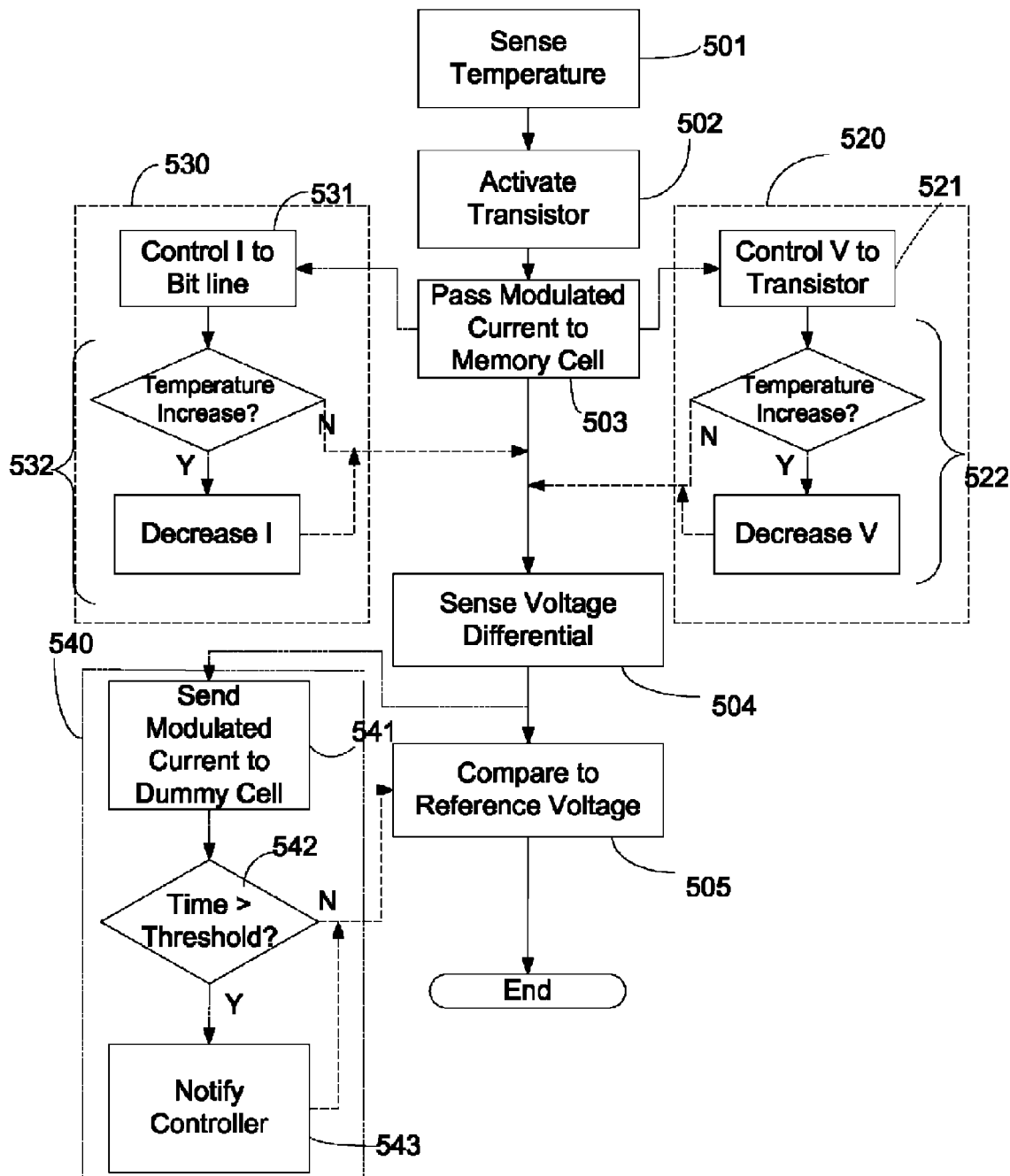
FIG. 5 is a flowchart illustrating embodiments of methods of reading data from a memory cell.

Also disclosed herein are methods of reading data from a memory cell, such as a ST-RAM cell. An exemplary method is depicted in FIG. 5. Such a method includes sensing the temperature in the vicinity of the ST-RAM cell, step 501, activating a transistor associated with the ST-RAM cell, step 502, passing a current across the ST-RAM cell, step 503, sensing the voltage differential across the ST-RAM cell, step 504 and comparing the sensed voltage differential to a reference voltage differential to determine the resistance across the ST-RAM cell, step 505, wherein the resistance across the ST-RAM cell indicates the data contained in the ST-RAM cell, wherein the current passed across the ST-RAM cell is modulated by the sensed temperature. Such methods can further include optional steps which can occur before, after, in combination with, or at any point in between the steps that were previously discussed.

As seen in FIG. 5, a method as disclosed herein can also include optional step 520. Optional step 520 can modulate the current passed across the ST-RAM cell by controlling the voltage to the transistor, step 521, (as discussed with respect to FIGS. 3a and 3b). In such an embodiment, the voltage is generally decreased as the temperature increases, as illustrated by 522. The voltage can generally be modulated by using an adjustable voltage regulator.

Optional step 530 can also be utilized in methods as disclosed herein. Optional step 530 can modulate the current passed across the ST-RAM cell by controlling the current to the bit line, step 531, (as discussed with respect to FIGS. 2a and 2b). In such an embodiment, the current is generally decreased as the temperature increases, as illustrate by 532. The current can generally be modulated by using a tunable current mirror for example.

Optional step 540 can also be utilized in methods as disclosed herein. Optional step 540 can determine a modulated reference voltage. As discussed above, the content of the ST-RAM cell is determined by comparing the voltage across the ST-RAM cell with a reference voltage. As the current across the ST-RAM cell is changed, the voltage that is indicative of a parallel and anti-parallel state will also change, therefore, the reference voltage can be changed as well. In an embodiment, the current across one or more dummy cells is modulated 541 in the same way that the current is modulated across the MTJ in order to read the value in the MTJ in order to determine the reference voltage. Modulating the current to obtain a modulated reference voltage can add additional time to a read operation 542, in such a case, a method can also include notifying a controller 543 when the time of determining a reference voltage surpasses a time threshold.

Figure 4:
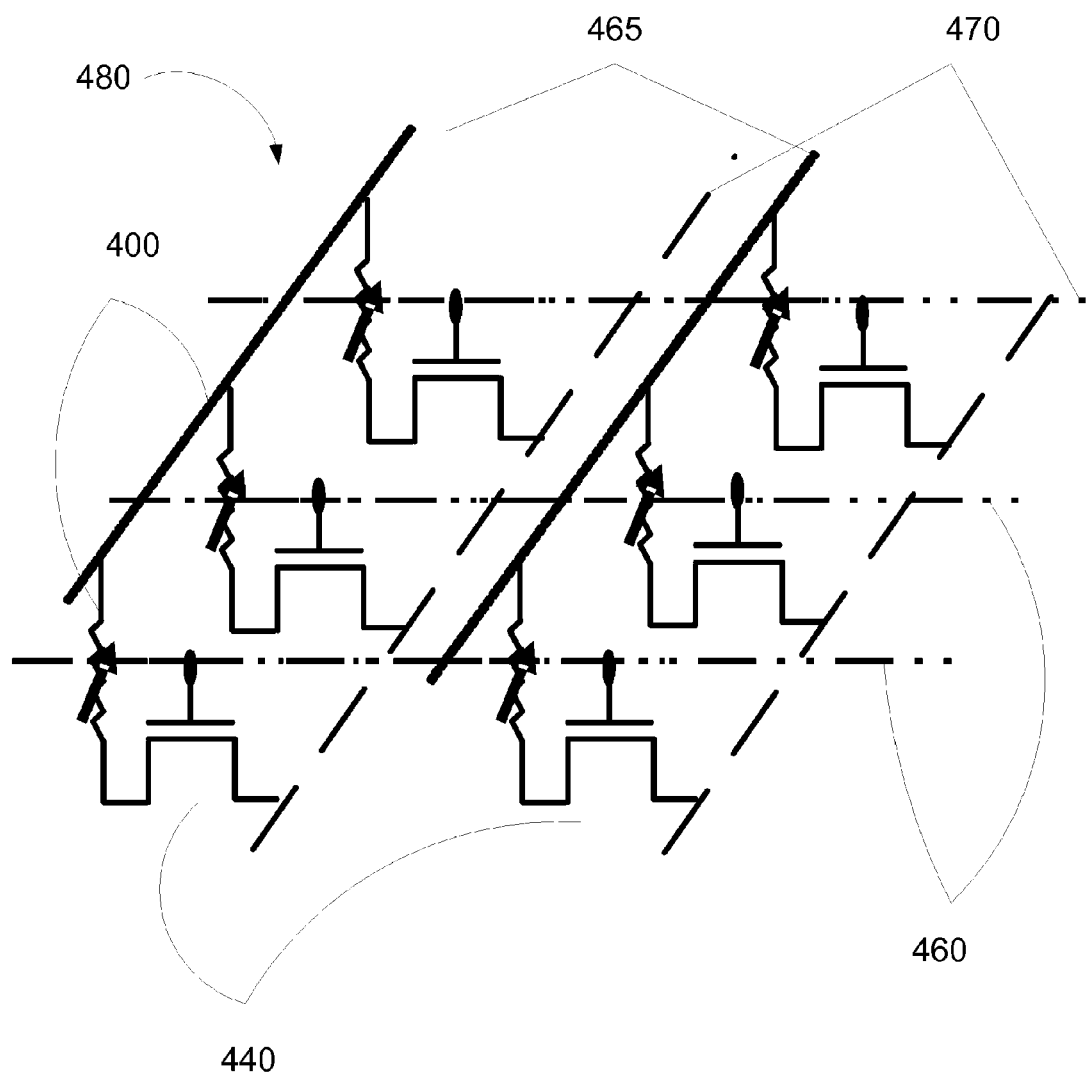
FIG. 4 is an illustration of an embodiment of an array of devices as disclosed herein.

Also disclosed herein are memory arrays that include memory devices as disclosed herein. FIG. 4 depicts an exemplary memory array 480 that includes a plurality of memory cells as disclosed herein. Generally, a plurality refers to at least two and generally refers to more than two. As seen in FIG. 4, each of the memory cells include a transistor 440 and a MTJ 400. The memory cells can be electrically connected in various manners and configurations by a word line 460, a source line 470, a bit line 465, or a combination thereof. Commonly utilized architectures and methods of electrically connecting memory cells into arrays can be utilized herein.

The plurality of memory cells are arranged in a matrix and bit lines 465 and source lines 470 connect the plurality of memory cells; also included is a plurality of word lines 460, wherein each of the plurality of transistors 440 are operatively coupled to a word line 460; also included is at least one temperature sensor; and control circuitry (as described with respect to FIGS. 2a, 2b, 3a and 3b) wherein the temperature sensor is operatively coupled to the control circuitry and the control circuitry and temperature sensor are configured to control a current across each of the memory cells.

Thus, embodiments of TEMPERATURE DEPENDENT METHOD OF READING ST-RAM are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A method of reading data from a ST-RAM cell, the method comprising:
    sensing the temperature in the vicinity of the ST-RAM cell;
    activating a transistor associated with the ST-RAM cell;
    passing a current through the ST-RAM cell;
    sensing the voltage differential across the ST-RAM cell; and
    comparing the sensed voltage differential to a reference voltage differential to determine the resistance across the memory cell, wherein the resistance across the memory cell indicates the data contained in the memory cell,
    wherein the current passed across the ST-RAM cell is modulated by the sensed temperature and by controlling the voltage applied to the transistor.

2. The method according to claim 1, wherein the voltage to the transistor is decreased as the temperature increases.

3. The method according to claim 1, wherein the voltage to the transistor is controlled by an adjustable voltage regulator.

4. The method according to claim 1, wherein the current passed across the ST-RAM cell is modulated by controlling the current to the bit line.

5. The method according to claim 4, wherein the current to the bit line is decreased as the temperature increases.

6. The method according to claim 4, wherein the current to the bit line is controlled by a tunable mirror.

7. The method according to claim 1, wherein the reference voltage is determined by sending a modulated current to at least one dummy cell.

8. The method according to claim 7 further comprising notifying a controller when the time necessary to determine the reference voltage surpasses a time threshold.

9. A memory device comprising:
    at least one memory cell, the memory cell comprising:
        a magnetic tunnel junction (MTJ); and
        a transistor, wherein the transistor is operatively coupled to the MTJ;
    a bit line;
    a source line;
    a word line, wherein the memory cell is operatively coupled between the bit line and the source line, and the word line is operatively coupled co the transistor;
    a temperature sensor; and
    a control circuitry,
    wherein the temperature sensor is operatively coupled to the control circuitry and the control circuitry and the temperature sensor are configured to control a current through the MTJ, and
    wherein the control circuitry and the temperature sensor modulate a voltage applied to the transistor.

10. The memory device according to claim 9 further comprising an analog to digital converter operatively coupled between the temperature sensor and the control circuitry.

11. The memory device according to claim 9 wherein the control circuitry comprises an adjustable voltage regulator.

12. The memory device according to claim 9, wherein the control circuitry and temperature sensor modulate current to the bit line.

13. The memory device according to claim 12, further comprising an analog to digital converter operatively coupled between the temperature sensor and the control circuitry.

14. The memory device according to claim 12, wherein the control circuitry comprises a tunable mirror.

15. The memory device according to claim 9 further comprising a reference voltage generator that is modulated by the temperature sensor.

16. A memory array comprising:
    a plurality of memory cells, each of the plurality of memory cells comprising:
        a magnetic tunnel junction (MTJ); and
        a transistor, wherein the transistor is operatively coupled to the MTJ;
    a plurality of bit lines;
    a plurality of source lines,
    wherein each of the plurality of memory cells is operatively coupled between a bit line and a source line, the plurality of memory cells are arranged in a matrix and the bit lines and source lines connect the plurality of memory cells;
    a plurality of word lines,
    wherein each of the plurality of transistors are operatively coupled to a word line;
    at least one temperature sensor; and
    a control circuitry,
    wherein the at least one temperature sensor is operatively coupled to the control circuitry, and the control circuitry and at least one temperature sensor are configured to control a current through each of the memory cells; and
    wherein the control circuitry controls the voltage applied to the transistor or the current to the bit line.

17. The array according to claim 16, wherein the at least one temperature sensor comprises a single temperature sensor positioned in a central location with respect to the plurality of memory cells.

* * * * *